United States Patent
Chen et al.

(10) Patent No.: US 10,862,029 B2
(45) Date of Patent: Dec. 8, 2020

(54) TOP ELECTRODE FOR DEVICE STRUCTURES IN INTERCONNECT

(71) Applicant: Taiwan Semiconductor Manufacturing Co., Ltd., Hsin-Chu (TW)

(72) Inventors: Hsia-Wei Chen, Taipei (TW); Wen-Ting Chu, Kaohsiung (TW); Kuo-Chi Tu, Hsin-Chu (TW); Chih-Yang Chang, Yuanlin Township (TW); Chin-Chieh Yang, New Taipei (TW); Yu-Wen Liao, New Taipei (TW); Wen-Chun You, Dongshan Township (TW); Sheng-Hung Shih, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/693,566

(22) Filed: Nov. 25, 2019

(65) Prior Publication Data

US 2020/0098983 A1 Mar. 26, 2020

Related U.S. Application Data

(63) Continuation of application No. 16/372,642, filed on Apr. 2, 2019, now Pat. No. 10,510,953, which is a (Continued)

(51) Int. Cl.
*H01L 45/00* (2006.01)
*H01L 27/24* (2006.01)

(52) U.S. Cl.
CPC ...... *H01L 45/1233* (2013.01); *H01L 27/2436* (2013.01); *H01L 27/2463* (2013.01);
(Continued)

(58) Field of Classification Search
CPC ............... H01L 45/1233; H01L 45/146; H01L 45/1253; H01L 45/16; H01L 45/12; H01L 45/122; H01L 45/124; H01L 27/2463
See application file for complete search history.

(56) References Cited

U.S. PATENT DOCUMENTS 5,985,698 A 11/1999 Gonzalez et al.
6,849,891 B1 2/2005 Hsu et al.
(Continued)

FOREIGN PATENT DOCUMENTS

WO 9641381 A1 12/1996
WO 2015088555 A1 6/2015

OTHER PUBLICATIONS

Chien, W.C., et al., "Multi-layer sidewall WOX resistive memory suitable for 3D ReRAM," 2012 Symposium on VLSI Technology (VLSIT), p. 153-154, Jun. 12-14, 2012.
(Continued)

*Primary Examiner* — Caridad Everhart
(74) *Attorney, Agent, or Firm* — Eschweiler & Potashnik, LLC

(57) ABSTRACT

Some embodiments relate to a device. The device includes a top electrode and a via disposed over the top electrode. A peripheral upper surface of the top electrode is above a central upper surface of the top electrode, and a tapered inner sidewall of the top electrode connects the peripheral upper surface to the central upper surface. The via establishes electrical contact with the tapered inner sidewall but is spaced apart from the central upper surface.

20 Claims, 6 Drawing Sheets

Related U.S. Application Data continuation of application No. 15/715,413, filed on Sep. 26, 2017, now Pat. No. 10,276,790, which is a continuation of application No. 15/262,703, filed on Sep. 12, 2016, now Pat. No. 9,780,302, which is a continuation of application No. 14/880,358, filed on Oct. 12, 2015, now Pat. No. 9,444,045, which is a continuation of application No. 14/087,082, filed on Nov. 22, 2013, now Pat. No. 9,172,036.

(52) U.S. Cl.
CPC .............. *H01L 45/06* (2013.01); *H01L 45/08* (2013.01); *H01L 45/085* (2013.01); *H01L 45/12* (2013.01); *H01L 45/122* (2013.01); *H01L 45/124* (2013.01); *H01L 45/1253* (2013.01); *H01L 45/146* (2013.01); *H01L 45/147* (2013.01); *H01L 45/16* (2013.01); *H01L 45/1666* (2013.01); *H01L 45/1683* (2013.01)

(56) References Cited

U.S. PATENT DOCUMENTS

| | | | |
|---|---|---|---|
| 7,169,637 | B2 | 1/2007 | Zhang et al. |
| 7,361,925 | B2 | 4/2008 | Happ et al. |
| 7,407,858 | B2 | 8/2008 | Li et al. |
| 7,579,612 | B2 | 8/2009 | Tang et al. |
| 7,608,848 | B2 | 10/2009 | Ho et al. |
| 7,795,606 | B2 | 9/2010 | Jin et al. |
| 7,816,661 | B2 | 10/2010 | Lai et al. |
| 7,833,898 | B2 | 11/2010 | Lee |
| 7,923,285 | B2 | 4/2011 | Lai et al. |
| 8,000,128 | B2 | 8/2011 | Li et al. |
| 8,009,454 | B2 | 8/2011 | Lee et al. |
| 2004/0248339 | A1 | 12/2004 | Lung |
| 2005/0030800 | A1* | 2/2005 | Johnson .............. G11C 13/0004 365/200 |
| 2006/0006374 | A1 | 1/2006 | Chang |
| 2006/0113520 | A1 | 6/2006 | Yamamoto et al. |
| 2006/0175597 | A1 | 8/2006 | Happ |
| 2007/0045606 | A1 | 3/2007 | Magistretti et al. |
| 2007/0262388 | A1 | 11/2007 | Ho et al. |
| 2008/0061341 | A1 | 3/2008 | Lung |
| 2008/0266940 | A1 | 10/2008 | Lai et al. |
| 2008/0296553 | A1 | 12/2008 | Philipp et al. |
| 2009/0039332 | A1 | 2/2009 | Lee et al. |
| 2009/0050872 | A1 | 2/2009 | Kuo et al. |
| 2010/0163834 | A1 | 7/2010 | Chang |
| 2010/0277969 | A1* | 11/2010 | Li ...................... G11C 13/0007 365/148 |
| 2011/0049462 | A1* | 3/2011 | Breitwisch .......... H01L 27/2436 257/4 |
| 2011/0186798 | A1* | 8/2011 | Kwon .................... H01L 45/06 257/2 |
| 2012/0092935 | A1 | 4/2012 | Kim et al. |
| 2012/0178210 | A1 | 7/2012 | Lee et al. |
| 2012/0241710 | A1 | 9/2012 | Liu et al. |
| 2013/0161707 | A1 | 6/2013 | Huang et al. |

OTHER PUBLICATIONS

Non-Final Office Action dated Dec. 5, 2014 for U.S. Appl. No. 14/087,082.
Notice of Allowance dated Jun. 17, 2015 for U.S. Appl. No. 14/087,082.
Non-Final Office Action dated Nov. 24, 2015 for U.S. Appl. No. 14/880,358.
Notice of Allowance dated May 16, 2016 for U.S. Appl. No. 14/880,358.
Non-Final Office Action dated Oct. 26, 2016 for U.S. Appl. No. 15/262,703.
Notice of Allowance dated May 10, 2017 for U.S. Appl. No. 15/262,703.
Non-Final Office Action dated Jun. 29, 2018 for U.S. Appl. No. 15/715,413.
Notice of Allowance dated Feb. 1, 2019 for U.S. Appl. No. 15/715,413.
Non-Final Office Action dated May 22, 2019 for U.S. Appl. No. 16/372,642.
Notice of Allowance dated Oct. 9, 2019 for U.S. Appl. No. 16/372,642.

\* cited by examiner

TOP ELECTRODE FOR DEVICE STRUCTURES IN INTERCONNECT

REFERENCE TO RELATED APPLICATIONS

This Application is a Continuation of U.S. application Ser. No. 16/372,642, filed on Apr. 2, 2019, which is a Continuation of U.S. application Ser. No. 15/715,413, filed on Sep. 26, 2017 (now U.S. Pat. No. 10,276,790, issued on Apr. 30, 2019), which is a Continuation of U.S. application Ser. No. 15/262,703, filed on Sep. 12, 2016 (now U.S. Pat. No. 9,780,302, issued on Oct. 3, 2017), which is a continuation of U.S. application Ser. No. 14/880,358, filed on Oct. 12, 2015 (now U.S. Pat. No. 9,444,045, issued on Sep. 13, 2016), which is a Continuation of U.S. application Ser. No. 14/087,082, filed on Nov. 22, 2013 (now U.S. Pat. No. 9,172,036, issued on Oct. 27, 2015). The contents of the above-referenced Patent Applications are hereby incorporated by reference in their entirety.

FIELD

The present disclosure relates to resistive random access memory devices and methods of manufacturing them.

BACKGROUND

Resistive random access memory (RRAM) has a simple structure, low operating voltage, high-speed, good endurance, and CMOS process compatibility. RRAM is the most promising alternative to provide a downsized replacement for traditional flash memory. RRAM is finding wide application in devices such as optical disks and non-volatile memory arrays.

An RRAM cell stores data within a layer of material that can be induced to undergo a phase change. The phase change can be induced within all or part of the layer to switch between a high resistance state and a low resistance state. The resistance state can be queried and interpreted as representing either a "0" or a "1".

In a typical RRAM cell, the data storage layer includes an amorphous metal oxide. Upon application of a sufficient voltage, a metallic bridge is induced to form across the data storage layer, which results in the low resistance state. The metallic bridge can be disrupted and the high resistance state restored by applying a short high current density pulse that melts or otherwise breaks down all or part of the metallic structure. The data storage layer quickly cools and remains in the high resistance state until the low resistance state is induced again.

DETAILED DESCRIPTION

An RRAM device includes an array of RRAM cells each having at least a top electrode, a dielectric layer, and a bottom electrode. It has been observed that a leakage path can form as a result of damage or contamination during patterning of the RRAM cells. Formation of the leakage path can be prevented by forming sidewall spacers after patterning the top electrodes and before patterning the dielectric layer and the bottom electrodes. The RRAM cells, however, can be damaged during the etch process used in forming the sidewall spacers. The present disclosure provides a blocking layer and related method that can be effective to mitigate or prevent such damage.

Figure 1:
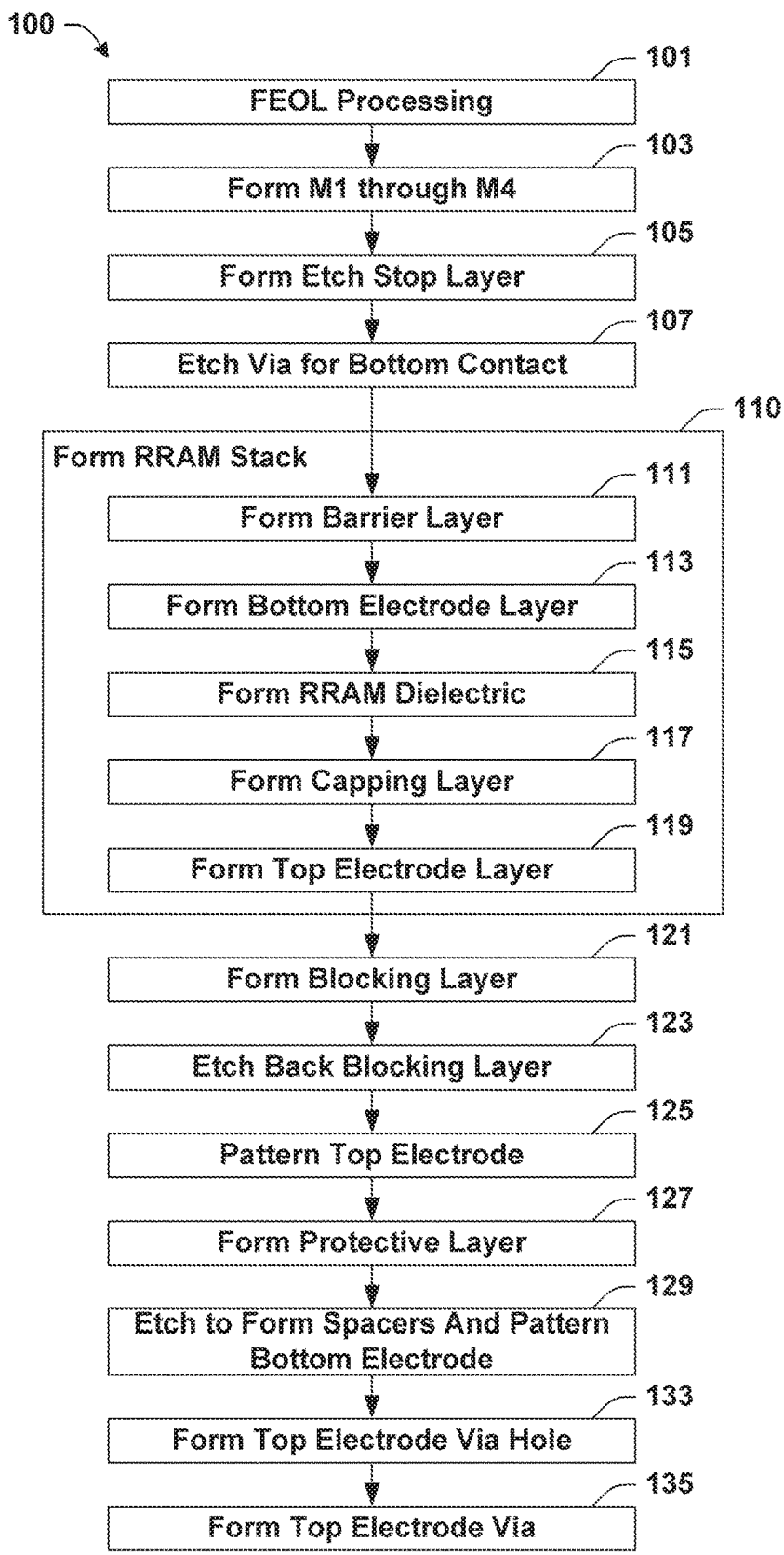
FIG. 1 is a flow chart of a method providing an example of an embodiment of the present disclosure.

FIG. 1 is a flow chart of a method 100 providing an example of an embodiment of the present disclosure. FIGS. 2-10 illustrate a portion of a device 200 as it undergoes manufacture by method 100. Device 200 provides an example of another embodiment of the present disclosure. FIG. 11 show additional structure and provides a larger context for the device 200 as compared to the perspective of FIGS. 2-10.

Method 100 begins with action 101, front end of line (FEOL) processing, and action 103, forming first (M1), second (M2), third (M3) and fourth (M4) metal interconnect layers 306 (see FIG. 11). In most embodiments, an RRAM cell 249 is formed over a metal interconnect layer 306. In some embodiments, the RRAM cell 249 is formed over the fourth metal interconnect layer 306 (M4) as shown in FIG. 11. However, RRAM cell 249 can be formed elsewhere in device 200 and the order of actions 101 and 103 in method 100 is optional.

Figure 2:
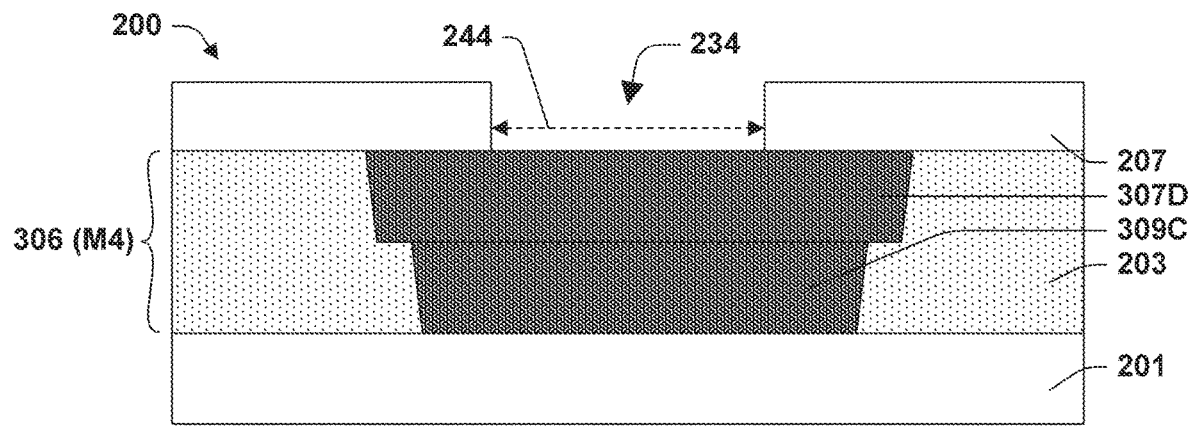
FIGS. 2-10 illustrate a portion of a device provided by another embodiment of the present disclosure as it undergoes manufacture by the method of FIG. 1.

Action 105 is forming an etch stop layer 207 over the fourth metal interconnect layer 306 (M4) and action 107 is patterning etch stop layer 207 to form an opening 234 as shown in FIG. 2. A bottom contact for RRAM cell 249 is exposed through opening 234. In most embodiments, the bottom contact is a via 307 formed in a metal interconnect layer 306. In some embodiments, the bottom contact is via 307D provided in the fourth metal interconnect layers 306 (M4) as shown in FIGS. 2-11.

Layer 207 provides an etch stop for forming vias (not shown) that will connect the fourth (M4) and fifth (M5) metal interconnect layers 306 and can have any composition suitable for that function and can be formed by any suitable process. In some embodiments, etch stop layer 207 is SiC, SiON or $Si_3N_4$. While layer 207 is generally an etch stop layer, it functions in process 100 to affect the shape of RRAM cell 249. This functionality can be realized without layer 207 being an etch stop layer. Accordingly, in some embodiments layer 207 is not an etch stop layer. In some embodiments, layer 207 is a dielectric layer over which RRAM stack 249 (the layers of materials that make up RRAM cell 249) are formed.

The width 244 of opening 234 and the thickness of layer 207 affect the shape of RRAM stack 249. In most embodiments, the thickness of layer 207 is in the range from 150 to 600 Å. In some embodiments, the thickness of layer 207 is in the range from 250 to 400 Å, for example, 300 Å. Layer 207 can be patterned by any suitable process. In most embodiments, layer 207 is patterned by photolithography and plasma etching. In most embodiments, the width 244 is in the range from 10 nm to 100 nm. In some embodiments, the width 244 is in the range from 45 nm to 100 nm, for example, 50 nm. In most embodiments, the aspect ratio of opening 234 (ratio of width 244 to the thickness of layer 207) is in the range from 1:1 to 4:1. In some embodiments the aspect ratio of opening 234 is in the range from 1.5:1 to 3:1, for example, 5:3.

Figure 3:
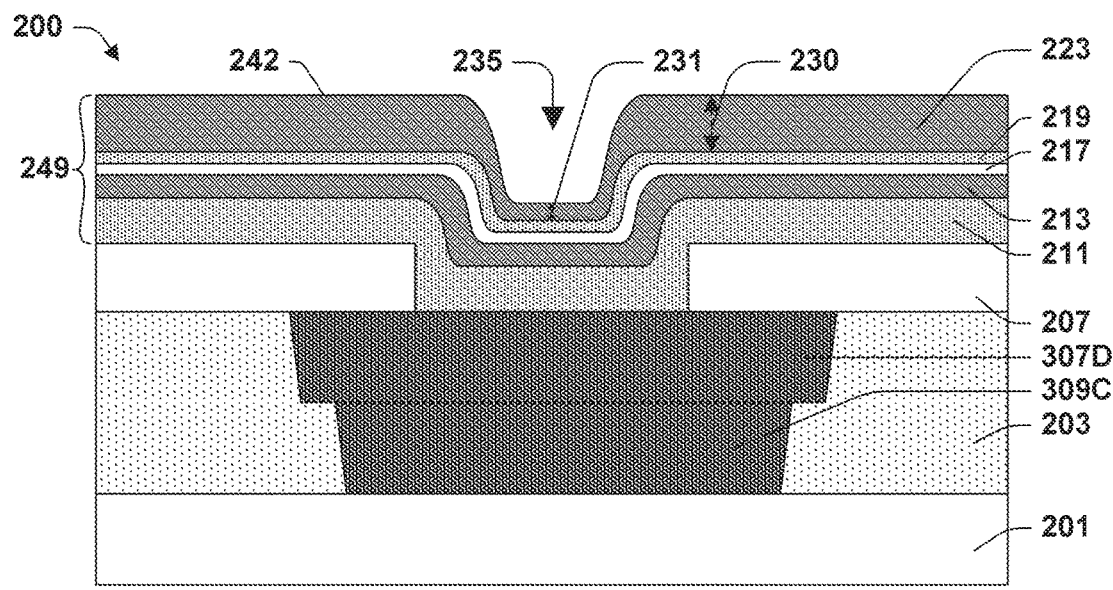

Process 100 continues with action 110, forming RRAM stack 249. In some embodiments, RRAM stack 249 includes diffusion barrier layer 211, bottom electrode layer 213, RRAM dielectric 217, capping layer 219, and top electrode layer 223 as shown in FIG. 3. Accordingly, in some embodiments action 110 includes action 111, forming diffusion barrier layer 211, action 113, forming bottom electrode layer 213, action 115, forming RRAM dielectric 217, action 117, forming capping layer 219, and action 119, forming top electrode layer 223 as shown in FIG. 1.

Diffusion barrier layer 211 is optional. It can be included to prevent contamination of bottom electrode 213 by material from a bottom contact such as via 307D. In some embodiments for which diffusion barrier layer 211 is included, the bottom contact is copper and bottom electrode 213 is a material susceptible to contamination by copper. In some of these embodiments, bottom electrode 213 is TiN. Diffusion barrier layer 211 can have any suitable composition and can be formed by any suitable process. In most embodiments, diffusion barrier layer 211 is a conductive oxide, nitride, or oxynitride of a metal selected from the group consisting of Al, Mn, Co, Ti, Ta, W, Ni, Sn, Mg. In some embodiments, diffusion barrier layer 211 is TaN. Diffusion barrier layer 211 can have any suitable thickness. A suitable thickness is large enough to provide an effective diffusion barrier while not being so large as to cause excessive resistance. In most embodiments, the thickness of diffusion barrier layer 211 is in the range from 20 Å to 300 Å. In some embodiments, the thickness of diffusion barrier layer 211 is in the range from 100 Å to 300 Å, for example, 200 Å.

Bottom electrode layer 213 can have any suitable composition and can be formed by any suitable process. Examples of suitable compositions include, without limitation, metals, metal nitrides, and doped polysilicon. In some embodiments, bottom electrode layer 213 is a metal. The metal could be, for example, Al, Ti, Ta, Au, Pt, W, Ni, Ir, or Cu. In some embodiments, bottom electrode layer 213 is a metal nitride. The metal nitride could be, for example, TaN. In some embodiments, bottom electrode layer 213 is a doped polysilicon. A doped polysilicon can be either a p+ doped polysilicon or an n+ doped polysilicon. In most embodiments, the thickness of bottom electrode layer 213 is in the range from 20 Å to 200 Å. In some embodiments, the thickness of bottom electrode layer 213 is in the range from 50 Å to 150 Å, for example, 100 Å.

RRAM dielectric 217 can be any material suitable for the data storage layer of an RRAM cell. A material suitable for the data storage layer of an RRAM cell is one that can be induced to undergo a reversible phase change between a high resistance state and a low resistance state. In some embodiments, the phase change is between an amorphous state and a metallic state. The phase change can be accompanied by or associated with a change in chemical composition. For example, an amorphous metal oxide may lose oxygen as it undergoes a phase change to a metallic state. The oxygen may be stored in a portion of RRAM dielectric 217 that remains in the amorphous state or in an adjacent layer. Although described as a dielectric, only the low resistance state need be a dielectric. In most embodiments, RRAM dielectric 217 is a high-k dielectric while in the low resistance state. In some embodiments, the RRAM dielectric 217 is a transitional metal oxide. Examples of materials that can be suitable for RRAM dielectric 217 include $NiO_X$, $Ta_yO_X$, $TiO_X$, $HfO_X$, $Ta_yO_X$, $WO_X$, $ZrO_X$, $Al_yO_X$, and $SrTiO_X$. In most embodiments, the thickness of RRAM dielectric 217 is in the range from 20 Å to 100 Å. In some embodiments, the thickness of RRAM dielectric 217 is in the range from 30 Å to 70 Å, for example, 50 Å.

Capping layer 219 is optional. In some embodiments, capping layer 219 provides an oxygen storage function that facilitates phase changes within the RRAM dielectric 217. In some embodiments, capping layer 219 is a metal or a metal oxide that is relatively low in oxygen concentration. Examples of metals that can be suitable for capping layer 219 include Ti, Hf, Pt and Al. Examples of metal oxides that can be suitable for capping layer 219 include $TiO_X$, $HfO_X$, $ZrO_X$, $GeO_X$, $CeO_X$. Capping layer 219 can have any suitable thickness. In most embodiments, the thickness of capping layer 219 is in the range from 20 Å to 100 Å. In some embodiments, the thickness of capping layer 219 is in the range from 30 Å to 70 Å, for example, 50 Å.

Top electrode layer 223 forms with a surface 242 having a recess 235 as shown in FIG. 3. Recess 235 forms as a result of and is centered over hole 234 in etch stop layer 207 where RRAM cell 249 interfaces with contact 307D. Surface 242 is an upper surface of top electrode layer 223. Words such as "upper" and "above" are used in the present disclosure to describe locations relative to a surface of a substrate 201 over which RRAM cell 249 is formed.

Top electrode layer 223 can have any of the compositions identified as suitable for bottom electrode layer 213. While diffusion barrier layer 211, bottom electrode layer 213, RRAM dielectric 217, and capping layer 219 can be deposited with either a conformal or a non-conformal deposition process, in most embodiments top electrode layer 223 is deposited with a non-conformal deposition process. A conformal deposition process forms a coating that is relatively uniform in thickness over the surface being coated. A non-conformal deposition process forms a coating whose thickness depends on the topography of the surface. The non-conformal deposition process of action 119 causes top electrode layer 223 to be much thinner at the bottom of recess 235 as compared to adjacent areas that are not recessed. Examples of conformal deposition processes include atomic layer deposition (ALD) and most chemical vapor deposition (CVD) processes. Sputter deposition is an example of a non-conformal deposition process suitable for forming top electrode layer 223.

Top electrode layer 223 can have any suitable thickness. In most embodiments, thickness 230, which is the thickness of top electrode layer 223 in areas that are not within any recess, is in the range from 100 Å to 400 Å. In some embodiments, thickness 230 is in the range from 150 Å to 300 Å, for example 250 Å. In most embodiments top electrode layer 223 forms with a minimum thickness 231 at the base of recess 235 that is less than the thickness 230. In some embodiments, the thickness 231 is half or less then thickness 230. In most embodiments, the thickness 231 is in the range from 50 Å to 200 Å. In some embodiments, the thickness 231 is in the range from 75 Å to 150 Å, for example, 100 Å.

Figure 4:
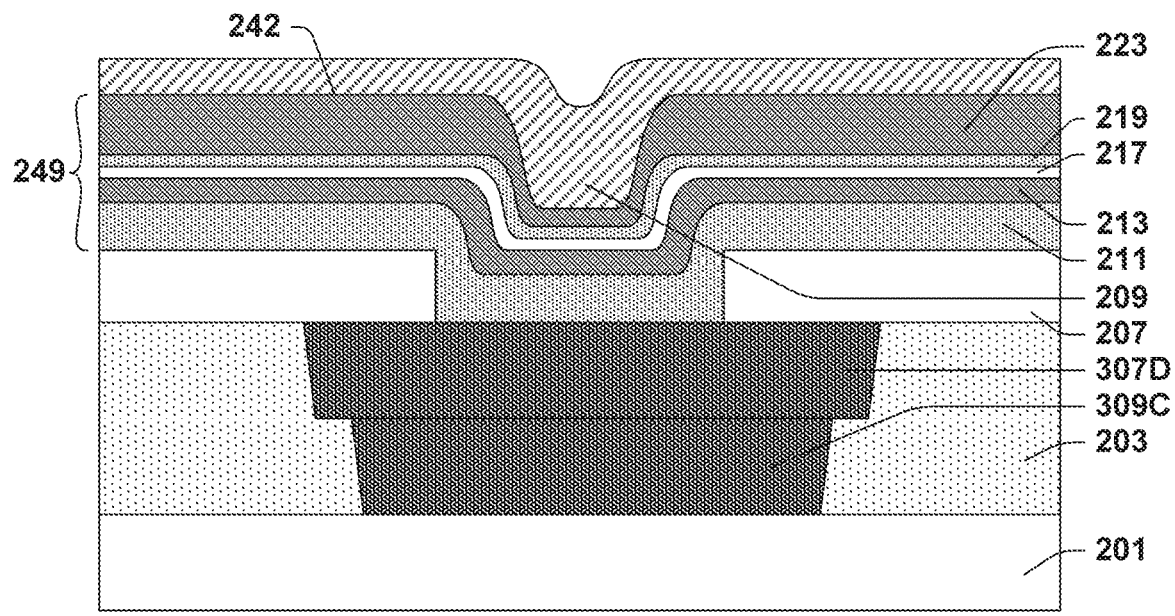
Figure 5:
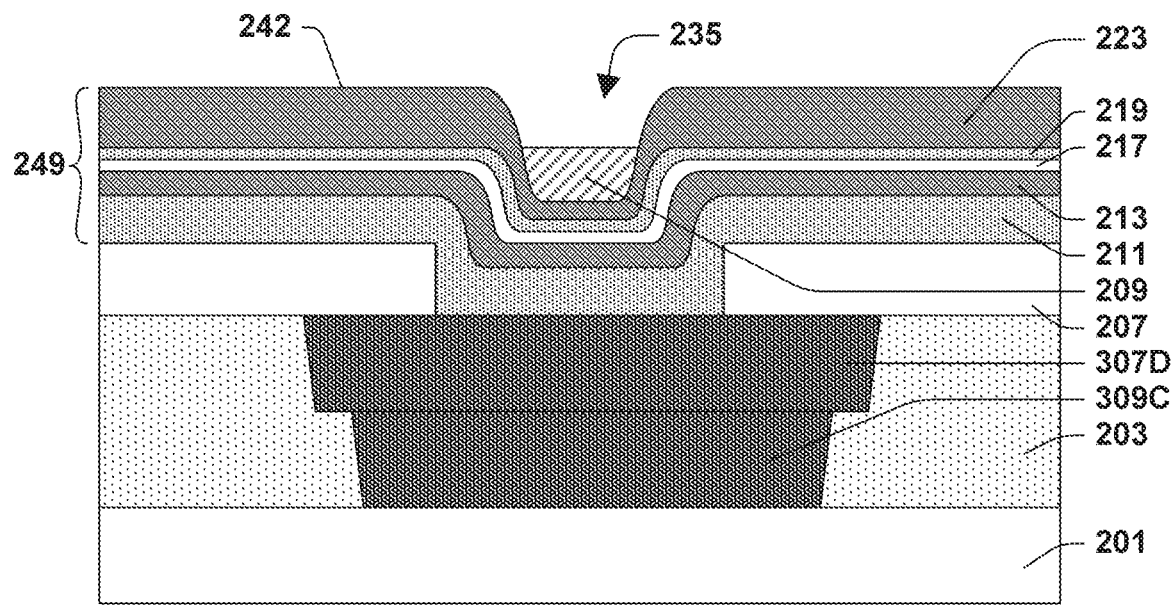

Referring to FIG. 1, process 100 continues with action 121, forming blocking layer 209 over RRAM stack 249 as shown in FIG. 4. Action 123 is an etch process that removes blocking layer 209 from most of the surface 242, but leaves a portion of blocking layer 109 remaining within recesses such as the recess 235 as shown in FIG. 5. In most embodiments, an island formed by the remaining blocking layer 209 is centered within recess 235 and fills the deepest part of recess 235. The island covers top electrode layer 223 where it is thinnest and protect RRAM cell 249 at these locations.

Areas of RRAM cell 249 adjacent the remaining blocking layer 209 are less susceptible to etch damage due to the greater thickness of top electrode layer 223 at these locations. In some embodiments, RRAM dielectric 217 is somewhat thinner within recess 235 than elsewhere, with the thinnest portion lying beneath the deepest part of recess 235. In these embodiments, the remaining blocking layer 209 covers RRAM cell 249 where RRAM dielectric 217 is thinnest. Conductive bridges preferentially form where RRAM dielectric 217 is thinnest. Damage to top electrode layer 223 and capping layer 219 adjacent the area covered by remaining blocking layer 209 is of relatively little consequence because conductive bridges preferentially form away from these damaged areas.

All or part of action 123, etching back blocking layer 209, can be deferred until after action 125, which is patterning top electrode layer 223. In some embodiments, blocking layer 209 is etched back and made thinner to a significant degree during action 129, etching to form spacers 221.

Blocking layer 209 can be formed by any suitable process and from any suitable material. In some embodiments, blocking layer 209 is a dielectric. In some embodiments, blocking layer 209 is a material commonly used for sidewall spacers. Examples of materials that can be suitable for blocking layer 209 include, without limitation, SiN, SiON and SiO$_2$. Blocking layer 209 is generally deposited with a thickness comparable to the depth of recess 235, which can be comparable to the thickness of etch stop layer 207. In most embodiments, blocking layer 209 is deposited to a thickness in the range from 150 to 600 Å. In some embodiments, blocking layer 209 is deposited to a thickness in the range from 250 to 400 Å, for example, 300 Å. In some embodiments, process 100 reduces blocking layer 209 to a maximum thickness in the range from 50 to 150 Å within recess 235.

Figure 6:
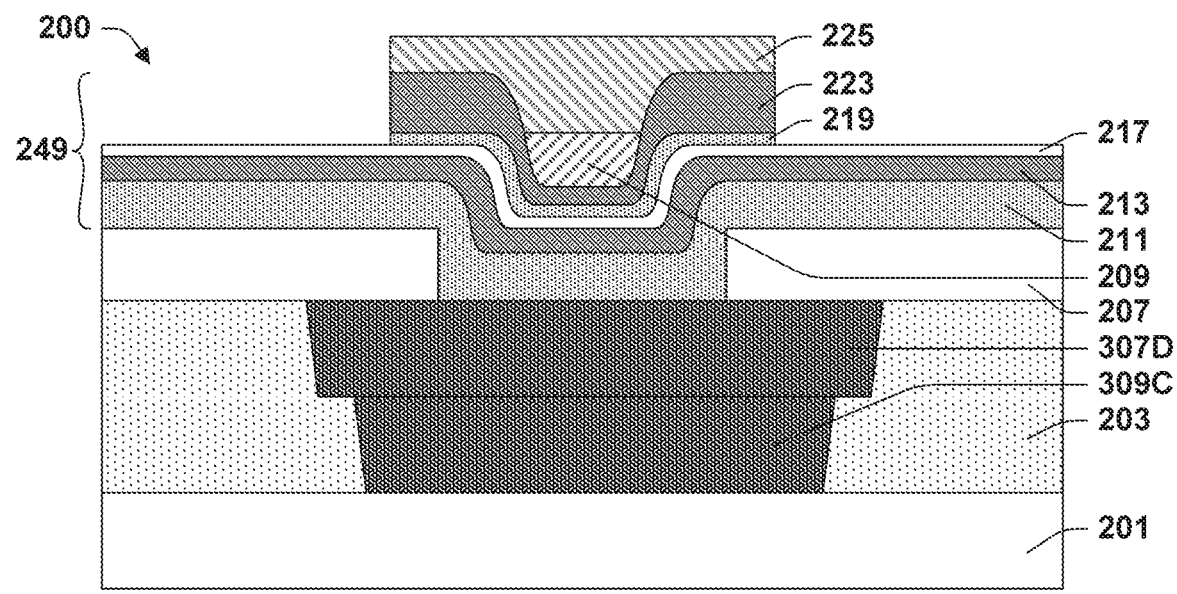

Action 125 patterns top electrode layer 223. Patterning top electrode layer 223 generally includes forming a mask 225 and etching as shown in FIG. 6. The etch generally continues through capping layer 219. In most embodiments, RRAM dielectric 217 provides an etch stop for patterning top electrode 223 and patterning of RRAM dielectric 217 and bottom electrode 213 is deferred until after sidewall spacers 221 have been formed. In most embodiments, top electrode 223 is patterned to be wider than recess 235.

Figure 7:
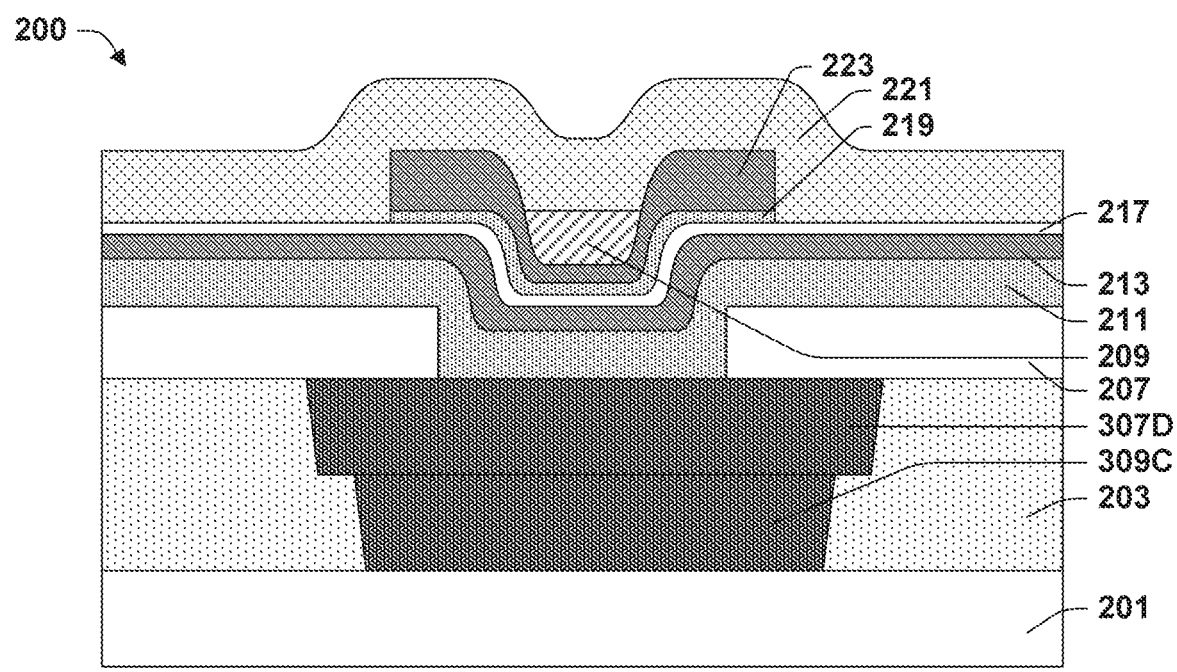

Action 127 is depositing a layer of spacer material 221 as shown in FIG. 7. Spacer material 221 can be any suitable spacer material. Examples of materials suitable for spacers 221 include, without limitation, SiN, SiON and SiO$_2$. In most embodiments, the material of spacers 221 is selected to allow etch selectivity between spacers 221 and blocking layer 209. For example, in one embodiment blocking layer 209 is SiON and spacers 221 are SiN.

Figure 8:
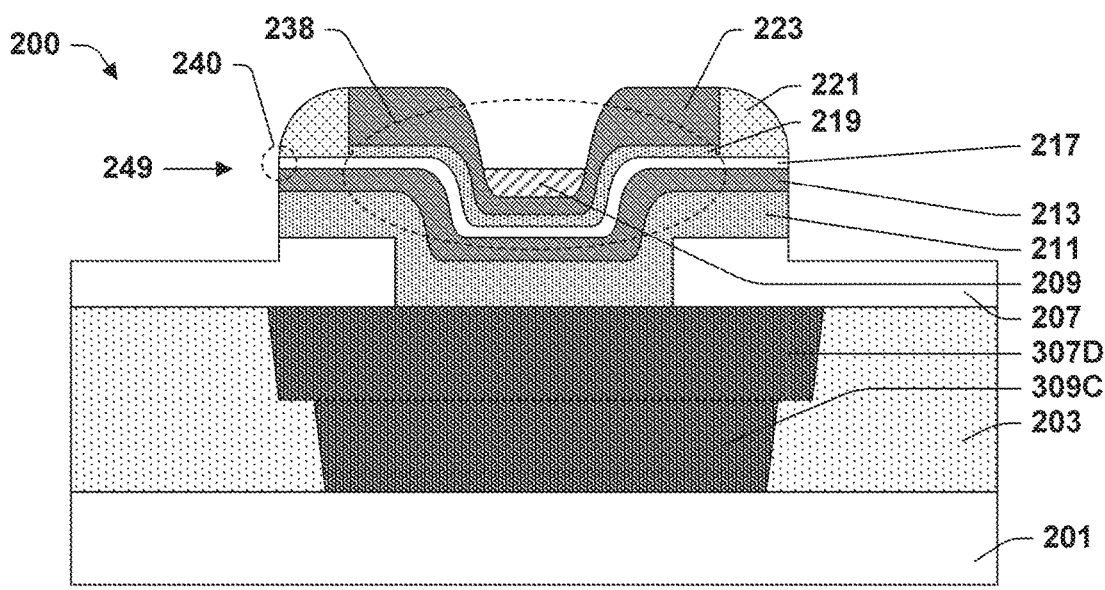

Action 129 is etching spacer material 221 to form spacers 221. In most embodiments, action 129 also includes patterning bottom electrode 213 whereby the structure resulting from this etch process is one such as shown in FIG. 8. In most embodiments, action 129 further includes patterning diffusion barrier layer 211 and RRAM dielectric 217 as shown in FIG. 8. In most embodiments blocking layer 209 is functional to protect RRAM cell 249 at the base of recess 235 while etching to form spacer 221. In most embodiments blocking layer 209 is functional to protect RRAM cell 249 at the base of recess 235 while etching to pattern bottom electrode 213. The etch conditions of action 129 can be varied as the etch progresses through these various layers. In most embodiments, etch stop layer 207 provides an etch stop for the etch process of action 129.

Spacer material 221 can be functional to protect top electrode 223 and capping layer 219 from damage and contamination during action during action 129. Spacers material 221 causes RRAM dielectric 217, bottom electrode layer 213, and diffusion barrier layer 211 to be cut off at a distance displaced from the functional area 238 of RRAM cell 249 as shown in FIG. 8. Any damage or contamination that occurs during action 129 is in areas such as the area 240 shown in FIG. 8, which is displaced from the area 238 within which conductive bridges will form.

Figure 9:
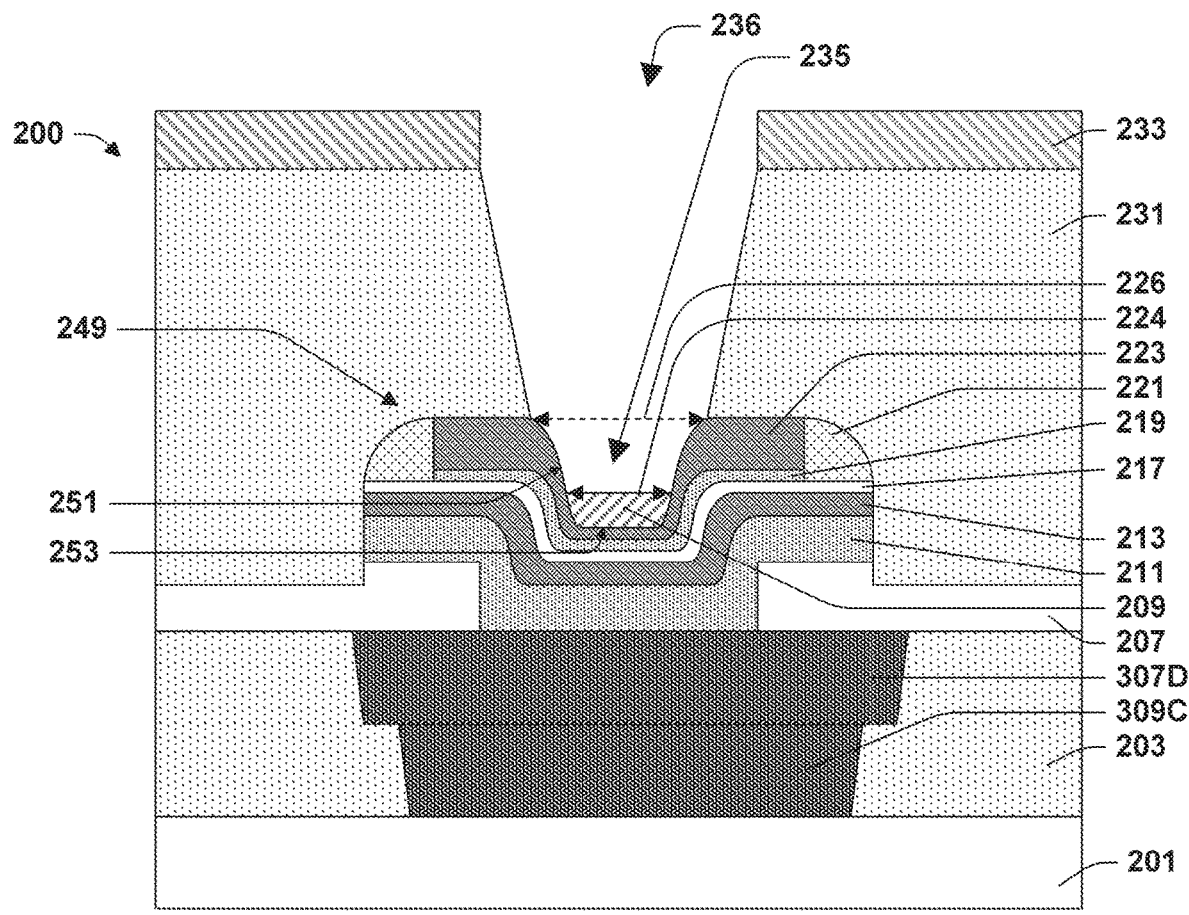
Figure 10:
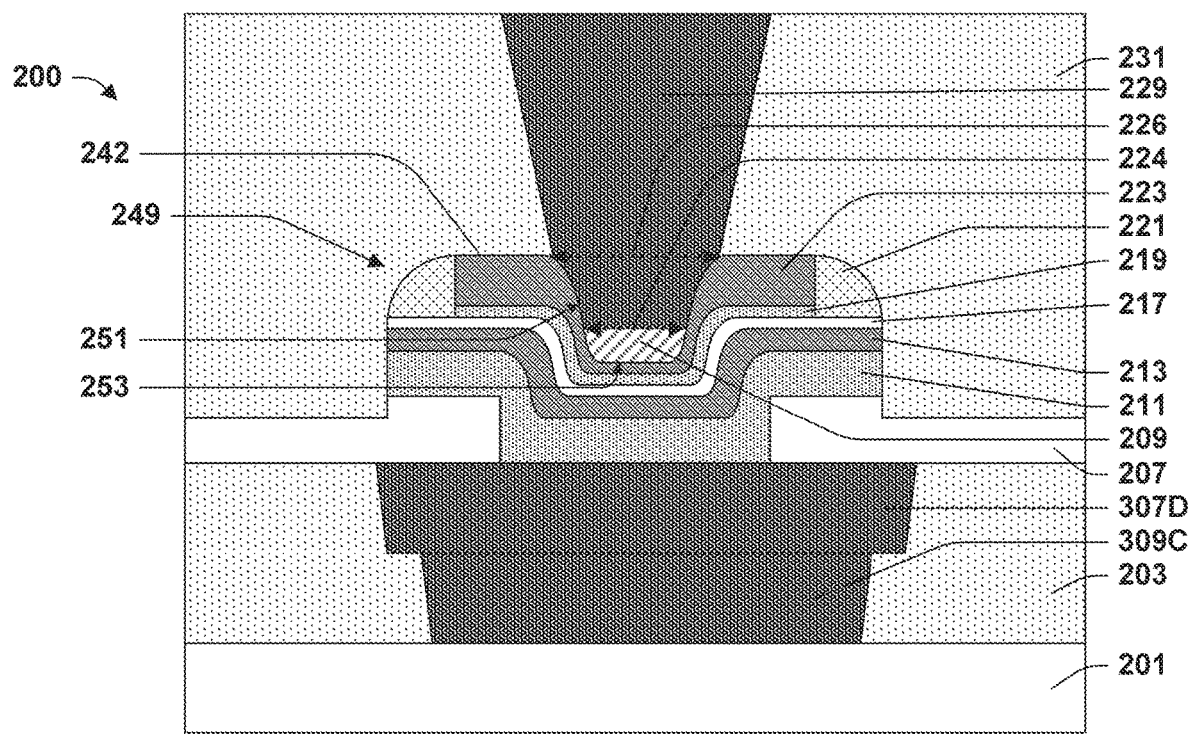
Figure 11:
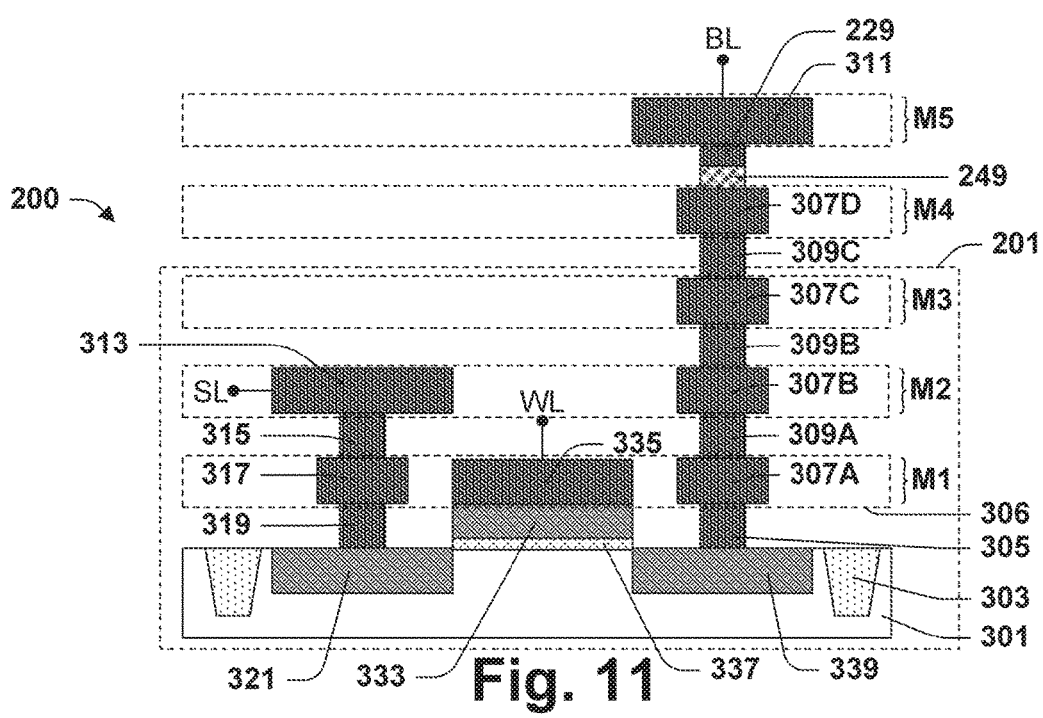
FIG. 11 provides a larger context for the device of FIGS. 2-10.

Action 133 of FIG. 1 is forming a via hole 236 as shown in FIG. 9 to define the shape of a via 229 that will contact top electrode 223 as shown in FIG. 10. Via hole 236 can be formed in the dielectric 231 that will surround via 229 in device 200. In some embodiments, via hole 236 is formed in a matrix of sacrificial material that is subsequently remove and replaced by dielectric 231. This can be advantageous when dielectric 231 is an extremely low-k dielectric that can be damaged during the processes of forming via hole 236 and via 229. In most embodiments, a mask 233 is formed and patterned using photolithography and via hole 236 is etched through an opening in mask 233 as shown in FIG. 9. Mask 233 can be subsequently removed. Action 135 fills via hole 236 with conductive material to form via 229 as shown in FIG. 10.

Via hole 236 is formed over recess 235 in upper surface 242 of top electrode 223. In some embodiments, the only portion of upper surface 242 of top electrode 223 that is exposed within via hole 236 is an area within recess 235. An island of blocking layer 209 is exposed within via hole 236. A portion 253 of upper surface 242 of top electrode 223 is covered by blocking layer 209, but another portion 251 in an area adjacent to and surrounding blocking layer 209 is exposed in via hole 236. Thus, although via 229 is formed above blocking layer 209, via 229 still interfaces with and contacts top electrode 223. An island of blocking layer 209 becomes sandwiched between and surrounded by top electrode 223 and via 229.

The width 226 of top electrode 223 that is exposed within via hole 236 is greater than the width 224 of the island of blocking layer 209 at the base of via hole 236. In most embodiments, the width 226 is in the range from 10 nm to 100 nm. In some embodiments, the width 226 is in the range from 45 nm to 60 nm, e.g., 50 nm. In most embodiments, the width 224 is in the range from 5 nm to 50 nm. In some embodiments, the width 224 is in the range from 20 nm to 40 nm, e.g., 30 nm.

FIG. 11 provides a broader perspective on the configuration of RRAM cell 249 within device 200. RRAM cell 249 is one in an array of RRAM cells. FIG. 11 shows that substrate 201, details of which are absent in FIGS. 2-10, includes a semiconductor substrate 301 having a transistor formed between isolation regions 303. The transistor includes a source region 321, a drain region 339, a gate 333, and gate dielectric 337. A source line 313 for operating RRAM cell 249 is formed in the second metal interconnect layer 306 (M2) and is connected to source region 321 through contact plug 319, a via 317 in the first metal interconnect layer 306 (M1), and another via 315. A word line 335 for addressing RRAM cell 249 is formed in the first metal interconnect layer 306 (M1) and contacts gate 333. The bottom electrode 211 of RRAM cell 249 is connected to drain region 339 through contact plug 305, contacts 307 formed in the first, second, third, and forth metal interconnect layers 306 (M1-M4), and vias 309 formed between these metal interconnect layers 306. Via 229 connects top electrode 223 to a bit line 311 formed in the fifth metal interconnect layer 306 (M5). In most embodiments, device 200 uses a 1T1R (one transistor, one resistor) RRAM device structure as shown in FIG. 11, however, RRAM cell 249 and the process 100 provided by the present disclosure can be applied with other RRAM device structures. Also, source line 313, word line 335, and bit line 311 can be located in different layers than shown in this example.

Metal interconnect layers 306 include conductive lines and vias in matrices of dielectric. The conductive lines and vias can be formed from any conductive material. In some embodiments, the conductive material is copper. The dielectrics can be any suitable dielectrics. In most embodiments, the dielectrics are low-k dielectrics. In some embodiments, the dielectrics are extremely low-k dielectrics. An extremely low-k dielectric is a material having a dielectric constant of about 2.1 or less. An extremely low-k dielectric is generally formed by a low dielectric material with 20% or more voids (pores or air gaps). Metal interconnect layers 306 can be formed by any suitable processes, including for example damascene and dual damascene processes.

The present disclosure provides an integrated circuit device including a resistive random access memory (RRAM) cell formed over a substrate. The RRAM cell includes a bottom electrode, a dielectric layer, and a top electrode having an upper surface. A blocking layer covers a portion of the upper surface. A via extends above the top electrode within a matrix of dielectric. The upper surface of the top electrode includes an area that interfaces with the blocking layer and an area that interfaces with the via. The area of the upper surface that interfaces with the via surrounds the area of the upper surface that interfaces with the blocking layer.

The blocking layer is functional during processing to protect the RRAM cell from etch damage while being structured in such a way as to not interfere with contact between the overlying via and the top electrode. The blocking layer can be configured to protect a thinnest portion of the top electrode where the RRAM cell is most vulnerable to etch damage. The blocking layer is particularly useful when the RRAM cell is formed with sidewall spacers. The sidewall spacers are most easily formed with an etch process that can damage the RRAM cell, absent the blocking layer.

The present disclosure provides an integrated circuit device that includes a resistive random access memory (RRAM) cell, a blocking layer over the RRAM cell, and a via over the RRAM cell. The RRAM cell has a recess in its upper surface. The blocking layer is within the recess and the via contacts the RRAM cell within the recess in an area surrounding the blocking layer.

The present disclosure provides a method of manufacturing an integrated circuit device. The method includes forming a first coating over a semiconductor substrate, forming a hole for a contact through the first coating, and forming a resistive random access memory (RRAM) stack within the contact hole and over the first coating. The RRAM stack forms with a recess centered over the contact hole. A blocking layer is formed over the top of the RRAM stack. The blocking layer is etched to expose part of the top of the RRAM stack while leaving a portion of the blocking layer covering the top of the RRAM stack within the deepest part of the recess. A second coating is formed over the RRAM stack and the blocking layer. A hole is etched through the second coating above the recess, the hole having sufficient width that it exposes the blocking layer left within the recess and also a portion of the top of the RRAM stack adjacent the blocking layer within the recess. The hole through the coating is filled to form a contact with the top of the RRAM stack.

The components and features of the present disclosure have been shown and/or described in terms of certain embodiments and examples. While a particular component or feature, or a broad or narrow formulation of that component or feature, may have been described in relation to only one embodiment or one example, all components and features in either their broad or narrow formulations may be combined with other components or features to the extent such combinations would be recognized as logical by one of ordinary skill in the art.

The invention claimed is:

1. A device, comprising:
   a top electrode having a recess in its upper surface;
   a blocking structure disposed over the top electrode and arranged within the recess such that the top electrode extends under the blocking structure continuously from one side of the blocking structure to another side of the blocking structure; and
   a via disposed over the blocking structure, wherein the via contacts the top electrode within the recess in an area above the blocking structure.

2. The device of claim 1, wherein the blocking structure comprises a dielectric material sandwiched between a lower surface of the via and the upper surface of the top electrode.

3. The device of claim 1, wherein the top electrode comprises:
   a central upper electrode portion having a first thickness; and
   a peripheral upper electrode portion having a second thickness that differs from the first thickness.

4. The device of claim 3, wherein the first thickness is less than the second thickness.

5. The device of claim 4, wherein the first thickness is half of or less than half of the second thickness.

6. The device of claim 1, further comprising:
   a bottom electrode, wherein the top electrode is arranged over the bottom electrode and wherein a dielectric layer separates the bottom electrode from the top electrode; and
   wherein the bottom electrode is disposed over a semiconductor substrate, and wherein at least one metal layer is disposed between the bottom electrode and the semiconductor substrate.

7. The device of claim 6, further comprising:
   sidewall spacers disposed over an upper surface of the bottom electrode and along outer sidewalls of the top electrode.

8. The device of claim 6, further comprising:
   an etch stop layer disposed over the at least one metal layer, wherein the etch stop layer has a hole through it; and
   wherein the bottom electrode is disposed over the hole and is wider than the hole.

9. The device of claim 8, wherein the via is aligned in an area over the hole.

10. The device of claim 6, wherein the bottom electrode has a first thickness ranging from 20 angstroms to 200 angstroms, the dielectric layer has a second thickness ranging from 30 angstroms to 70 angstroms, and the top electrode has a third thickness ranging from 100 angstroms to 400 angstroms.

11. A device structure arranged within an interconnect structure over a semiconductor substrate, the device structure comprising:
   an upper electrode that exhibits a u-shaped or v-shaped cross-section;
   a via having an outer via sidewall that contacts an inner sidewall of the u-shaped or v-shaped cross-section; and
   a sidewall spacer structure having an inner sidewall contacting an outermost sidewall of the upper electrode, a lower surface extending away from the outermost sidewall of the upper electrode, and an outer sidewall that is a convex curve connecting the inner sidewall and the lower surface.

12. The device structure of claim 11, wherein the upper electrode includes a central upper surface and a peripheral upper surface, the peripheral upper surface surrounding the central upper surface and the central upper surface being recessed relative to the peripheral upper surface, the device structure further comprising:
a blocking structure separating a bottom surface of the via from the central upper surface of the upper electrode.

13. The device structure of claim 11, wherein the inner sidewall of the u-shaped or v-shaped cross-section is a tapered inner sidewall, further comprising:
a blocking structure arranged under the via, the blocking structure comprising an outer sidewall that contacts the tapered inner sidewall of the upper electrode.

14. The device structure of claim 11, further comprising:
a bottom electrode spaced apart from the upper electrode by an insulating layer.

15. The device structure of claim 14:
wherein the bottom electrode comprises: Al, Ti, Ta, Au, Pt, W, Ni, Ir, or Cu;
wherein the insulating layer is a transitional metal oxide; and
wherein the upper electrode comprises: Al, Ti, Ta, Au, Pt, W, Ni, Ir, or Cu.

16. An integrated circuit device, comprising:
a top electrode comprising a peripheral top electrode portion having a peripheral upper surface, such that an inner sidewall of the top electrode extends downwardly from the peripheral upper surface, forming a convex curve; and
a via over the top electrode, wherein the via has an outer via sidewall that contacts the inner sidewall of the top electrode, and a central portion of a bottom surface of the via does not contact the top electrode.

17. The integrated circuit device of claim 16, wherein the top electrode further comprises a central top electrode portion having a central upper surface, wherein the inner sidewall of the top electrode extends between the peripheral upper surface and the central upper surface.

18. The integrated circuit device of claim 17, further comprising:
a blocking structure comprising a dielectric material disposed over the central upper surface and separating the central upper surface from the bottom surface of the via.

19. The integrated circuit device of claim 16, further comprising:
a bottom electrode, wherein the top electrode is arranged over the bottom electrode and wherein a dielectric layer separates the bottom electrode from the top electrode.

20. The integrated circuit device of claim 19:
wherein the bottom electrode comprises: Al, Ti, Ta, Au, Pt, W, Ni, Ir, or Cu;
wherein the dielectric layer is a transitional metal oxide; and
wherein the top electrode comprises: Al, Ti, Ta, Au, Pt, W, Ni, Ir, or Cu.

* * * * *